June 23, 1970 R. W. HAGER 3,517,278

FLIP CHIP STRUCTURE

Filed Oct. 2, 1967

INVENTOR.

RICHARD W. HAGER

BY Flehr, Hohbach, Test, Albritton & Herbert

ATTORNEYS

United States Patent Office 3,517,278

Patented June 23, 1970

3,517,278

FLIP CHIP STRUCTURE

Richard W. Hager, Los Altos, Calif., assignor to Teledyne, Inc., Mountain View, Calif., a corporation of Delaware Filed Oct. 2, 1967, Ser. No. 672,169

Int. Cl. H01l 1/14

U.S. Cl. 317—234 3 Claims

ABSTRACT OF THE DISCLOSURE

A flip chip structure for integrated circuits in which the circuit chip is bonded to a substrate having a printed circuit and raised contact pads serving to interconnect contact areas on the chip. The contact pads are initially affixed to the substrate. The substrate and chip both have the same base material, such as silicon. In addition, the raised contact pads are of sufficient height to permit cross-overs of existing conductors on the circuit chip.

This invention is directed to a flip chip structure in which integrated circuit chips are flipped upon a common substrate.

The basic "flip chip" technology is largely for the purpose of simplification of the packaging of a circuit which contains many subcircuits each of which are on a separate semiconductive integrated circuit substrate termed a "chip." With the use of this flip chip type packaging it is, of course, desirable to have a technique which is simple, provides a high yield and is flexible in that it may be applied to many different types of integrated circuits. The prior art deposits the raised contact pad necessary to make contact on the integrated circuit chip. This step inherently lowers the yield of satisfactory integrated circuit chips. In addition, differences of materials between the substrate on which the chips are to be flipped and the chips, themselves, create processing problems since two different materials must be processed in different ways, in different apparatuses and, in addition, react differently to ambient conditions.

It is an object of the present invention to provide an improved flip chip structure.

It is another object of the invention to provide a flip chip structure which inherently has a high yield, minimizes processing steps, and is flexible in application to many different types of chips.

Accordingly, there is provided a flip chip structure in which the integrated circuit chips are constructed of a predetermined semiconductive base material and are flipped on a common substrate and packaged together. The substrate includes raised contact pads deposited on the substrate for making electrical contact with predetermined contact areas on the chip. The substrate is constructed of a material substantially identical to said semiconductive base material chip. Thin film conductive leads are also carried on the substrate and make ohmic contact with the contact pads.

A more detailed form of the invention is utilized where the integrated circuit chip includes a conductor pattern having at least two spaced contact areas which are separated by an intermediate conductor. The substrate includes a pair of raised contact pads positioned on the substrate to mate with the spaced areas on the chip. The substrate includes a conductive strip connecting the two raised pads, the pads having a sufficient height to maintain an air gap between the strip and the intermediate conductor on the chip.

Other objects of the invention will become more clearly apparent from the following description.

Referring to the drawing.

Figure 1:
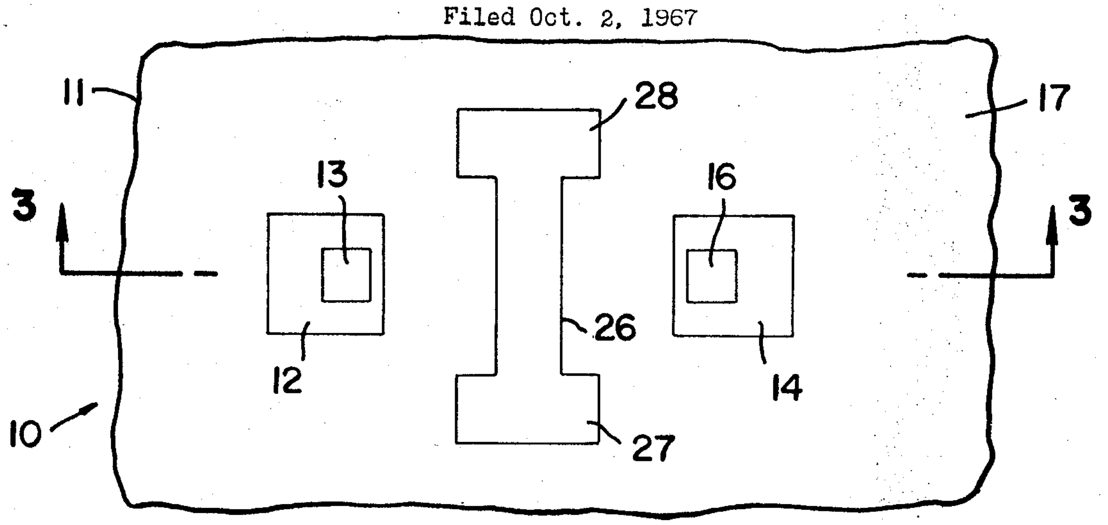
FIG. 1 is a fragmentary view of the top surface of an integrated circuit chip used in the flip chip structure of the present invention.
Figure 2:
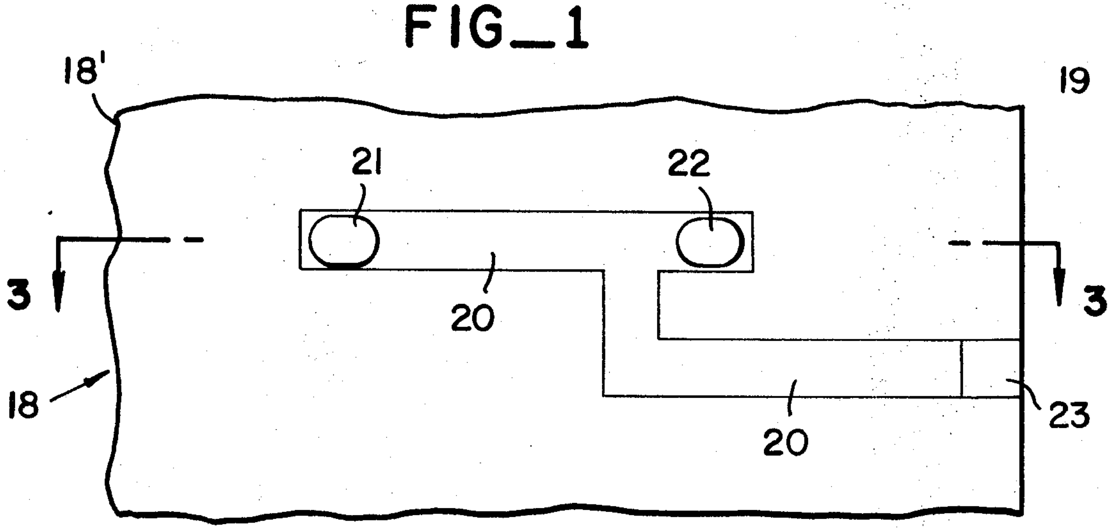
FIG. 2 is a fragmentary view of the top surface of a substrate embodying the present invention.
Figure 3:
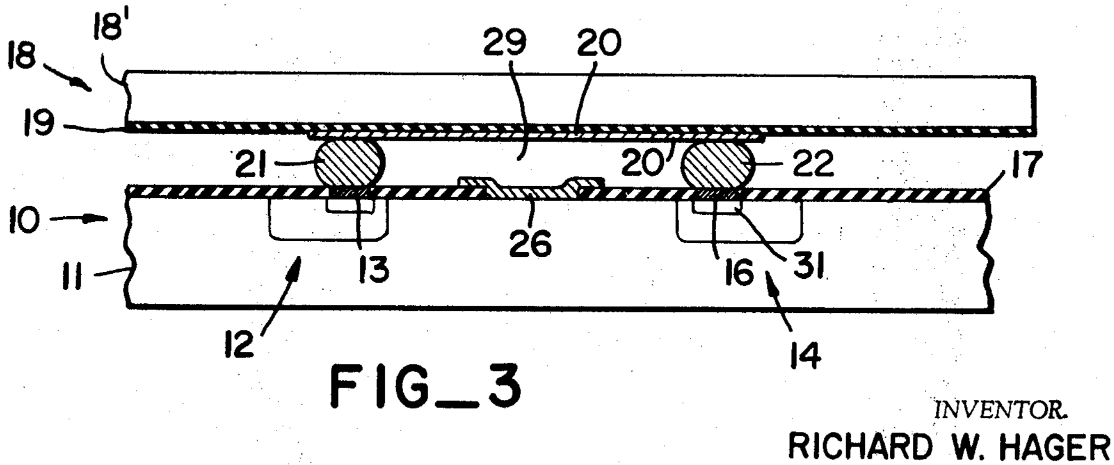
FIG. 3 is a cross-sectional view along the lines 3—3 of FIGS. 1 and 2 showing the structures of the two figures sandwiched together to form a flip chip structure.

FIG. 1 shows the top surface of an integrated circuit chip 10 having substrate 11, of silicon, on which are placed a first planar transistor 12 with an aluminum contact pad 13 and a second planar transistor 14 with a contact pad 16 thereon. Both the aluminum contact pads 13, 16 and the transistors 12, 14 are formed by ordinary diffusion and etching processes. The aluminum contact pads extend through openings in the passivating surface 17, typically of silicon dioxide, which covers the surface of substrate 11 to make ohmic connection to the underlying semiconductor region. FIG. 1 represents a portion of an integrated circuit chip which is to be flipped upon a substrate, as illustrated in FIG. 2, to form a flip chip structure (FIG. 3). Normally, of course, several of these chips would be placed on the same substrate and the chip could also incorporate a larger number of devices.

Referring now specifically to FIG. 2, there is shown a substrate 18 having a base 18' of a predetermined material which in the present embodiment is silicon with a surface 19 of silicon dioxide. Aluminum thin film conductor 20 is carried on the oxide surface 19. The conductor may be formed by well known techniques such as evaporation and etching. Evaporated gold contacts 21 and 22 are carried on the conductor 20. The aluminum conductor terminates at a convenient edge location 23 where contact may be made to a next adjacent circuit or to the output terminals of the final device of which this circuit portion is a part. Gold bumps 21 and 22 are normally applied by an evaporation process well known in the art.

Bumps 21 and 22 which serve as raised contacts are positioned on the substrate to mate with spaced contact areas such as 13 and 16 on chip 10. This is shown in FIG. 3 where the chip 10 is mated with the substrate 18. The mating is normally accomplished by a thermal compression process but other techniques, such as ultrasonic bonding, may be used where appropriate.

The chip shown in FIG. 1 also includes on its surface a conductor 26 partially overlaying oxide 17, which couples devices 27 and 28. The conductor 26 represents a circuit conductor but alternatively may be a passive component, such as a capacitor. In any case it is apparent that to directly conductively connect areas 13 and 16 on the face of the chip 10 would be difficult because of the necessity of crossing over conductive strip 26 without unwanted interconnection therewith.

Thus in accordance with the invention, contact pads 21, 22 have a sufficient height to allow an air gap 29 (FIG. 3) of several microns to exist between the conductor 20 of the substrate and conductor 26. Thus an effective and simple crossover is provided over the conductor strip 26.

FIG. 3 shows in detail the bond or electrical contact made between chip 10 and substrate 18. Referring first to chip 10, ohmic contact is made with a semiconductive region 31, which is part of planar transistor 14, by aluminum contact 16. On substrate 18 an aluminum conductive layer 20 has been evaporated and the gold pad 22 deposited thereon. Between gold pad or bump 22 and aluminum contact 16 a bond has been made.

With the initial provision of the contact bumps or raised contact pads on the substrate instead of the chip, the yield of semiconductor chips is increased since the processing step of placing a gold bump on the chip is eliminated. The yield of the semiconductive devices is now the same as in a standard integrated circuit process where flip chip packaging is not to be used. In the case of the substrate, the additional step of placing the gold contacts on the substrate is relatively inexpensive and, of course, the yield on the substrates is less critical and is independent of the integrated chips.

By providing that the material of substrate 18 is of the same type as that for the chip 10, several advantages accrue. The main one is the fact that the identical substrates have the same isotropy; that is, there is no thermal mismatch, thermal shock, and the general achieved device performance in normal and extreme test conditions can be expected to be equal for the silicon integrated circuit chips as well as for the silicon substrates. From a processing point of view the use of the same material makes the technologies and processing of these materials compatible. For example, the chemical properties, surface, flatness and smoothness and surface physics of the chip and substrate are the same. In addition, batch processing may be used with the silicon substrate and the silicon integrated circuit chip. Lastly, improvement in semiconductor technologies, such as oxidation, diffusion, photoetching, metal deposition, insulated deposition, bonding, die attaching, etc., can be effectively utilized.

Flexibility is also achieved in semiconductor chip use by the present invention since any existing chip can be converted to a flip chip package when all of the contact areas are on the one surface. In other words, existing chips where contact areas are brought out to the edge for later lead connection can now be placed in a flip chip package because of the initial deposition of the contact pads on the substrate on which the chips are to be flipped.

Finally, by the use of the substrate with gold contact pads having a sufficient thickness, crossover of existing conductor patterns on an integrated semiconductive chip may also be accomplished. This again solves a problem which is ordinarily expensive to overcome.

I claim:

1. In a flip chip structure in which integrated circuit chips are constructed of a predetermined semiconductive base material and are flipped upon a common substrate and packaged together, said integrated circuit chip including a conductor pattern having at least two spaced contact areas which are separated by an intermediate conductor, said substrate including a pair of raised contact pads deposited thereon making electrical contact with predetermined contact areas on a chip, and positioned on said substrate to mate with said spaced areas on said chip, said substrate including a conductive strip connecting said two raised pads, said pads having a sufficient height to maintain an air gap between said strip and said intermediate conductor on said chip, said substrate comprising a material substantially identical to said chip base material and including thin film conductive leads carried on said substrate and making ohmic contact with said contact pads.

2. A flip chip structure as in claim 1 where said substrate includes an insulating layer on which said contact pads and conductive leads are deposited.

3. A structure as in claim 1 where said chip base material is silicon and said substrate is silicon.

References Cited

UNITED STATES PATENTS

| | | | |
|---|---|---|---|
| 3,294,988 | 12/1966 | Packard | 317—234 X |
| 3,368,116 | 2/1968 | Spaude | 317—101 |
| 3,388,301 | 6/1968 | James | 317—234 |
| 3,403,438 | 10/1968 | Best et al. | 29—577 |

OTHER REFERENCES

IBM Technical Disclosure Bulletin, Chip Read-Only Memory, by E. T. Heitzman, vol. 8, No. 2, July 1965, pp. 333 and 334.

JOHN HUCKERT, Primary Examiner

R. F. POLISSACK, Assistant Examiner

U.S. Cl. X.R.

174—68.5; 317—101, 235